United States Patent
Lee et al.

(10) Patent No.: US 7,304,841 B2
(45) Date of Patent: Dec. 4, 2007

(54) CONNECTION ARRANGEMENT OF BLADE SERVER

(75) Inventors: Chun-Liang Lee, Taipei (TW); Chih-Hung Kuo, Taipei (TW)

(73) Assignee: Inventec Corporation, Taipei (TW)

( * ) Notice: Subject to any disclaimer, the term of this patent is extended or adjusted under 35 U.S.C. 154(b) by 239 days.

(21) Appl. No.: 11/144,654

(22) Filed: Jun. 6, 2005

(65) Prior Publication Data

US 2006/0274496 A1 Dec. 7, 2006

(51) Int. Cl.
*H05K 7/20* (2006.01)
*H05K 7/00* (2006.01)

(52) U.S. Cl. ............. 361/687; 361/685; 361/695

(58) Field of Classification Search ............ 361/687, 361/387, 692, 695, 724–727, 719–720, 685
See application file for complete search history.

(56) References Cited

U.S. PATENT DOCUMENTS

| | | | |
|---|---|---|---|
| 6,012,624 A * | 1/2000 | French et al. ............. 228/119 |
| 6,392,884 B1 * | 5/2002 | Chou .......................... 361/687 |
| 6,487,039 B1 * | 11/2002 | Bernett ..................... 360/97.02 |
| 6,621,693 B1 * | 9/2003 | Potter et al. ................ 361/685 |
| 6,867,963 B2 * | 3/2005 | Staiano ....................... 361/685 |
| 2004/0032716 A1 * | 2/2004 | Roan .......................... 361/687 |
| 2004/0052046 A1 * | 3/2004 | Regimbal et al. ........... 361/687 |
| 2005/0259395 A1 * | 11/2005 | Espinoza-Ibarra et al. .. 361/695 |

* cited by examiner

*Primary Examiner*—Jayprakash Gandhi
*Assistant Examiner*—Zachary M Pape
(74) *Attorney, Agent, or Firm*—Bacon & Thomas, PLLC

(57) ABSTRACT

The present invention is to provide a connection arrangement of a blade server comprising a case having a plurality of holes at a front of the case, a first circuit board and a second circuit board both in the case, and a plurality of walls disposed between the first circuit board and the second circuit board for forming a passage therebetween having two ends open to the front and the rear of the case. An electronic device (e.g., hard disk drive) is adapted to electrically connect to the second circuit board by insertion, and a channel corresponding to the passage is then formed between the electronic device and the first circuit board for improving heat dissipation performance thereof.

6 Claims, 2 Drawing Sheets

CONNECTION ARRANGEMENT OF BLADE SERVER

FIELD OF THE INVENTION

The present invention relates to blade servers and more particularly to such a blade server comprising a case having a plurality of holes at a front of the case, a first circuit board and a second circuit board both in the case, and a plurality of walls disposed between the first circuit board and the second circuit board for forming a passage between the first circuit board and the second circuit board, wherein the passage has two ends open to the front and the rear of the case, an electronic device (e.g., hard disk drive) is adapted to electrically connect to the second circuit board by insertion, and a channel is then formed between the electronic device and the first circuit board for improving heat dissipation performance thereof.

BACKGROUND OF THE INVENTION

A conventional blade server comprises a case including a plurality of holes at the front of the case, a circuit board in the case and including an L-shaped connector having one end electrically connected to the circuit board and the other end electrically connected to a hard disk drive fixedly mounted on the circuit board, a plurality of fans at the rear of the case, the fans being adapted to drive air out of the case. In an operation of the blade server, the fans are activated to drive hot air caused by the operation out of the case. At the same time, external cold air is drawn into the case through the holes. A cold air current is thus formed and blown along a top surface of the circuit board. As a result, temperature on the top surface of the circuit board is decreased significantly to be in the range of operating temperature of the circuit board.

Moreover, the blade server is mounted on a chassis in its operating position. The most significant feature of the blade server is that a plurality of chipsets, electronic components, and interface devices are provided on the circuit board in its limited internal space of the case. Thus, the blade server has an improved performance as compared to other existing ones. However, high temperature can be generated by the chipsets, electronic components, and interface devices during operation. Further, as stated above the chipsets, electronic components, and interface devices are provided in the limited internal space of the case. As a result, the blade server tends to operate in an undesired overheat condition. Thus, it is important to consider how to carry out an effective heat dissipation in the design phase of the blade server.

Height of the case of blade server is 1 U equal to 1¾" or 44.45 mm and height of the hard disk drive installed therein is 9.5 mm or 0.37". Thus, cold air current flowing from the front to the rear of the case is blocked by the hard disk drive. This can undesirably decrease heat dissipation over the top surface of the circuit board. That is, cold air current cannot uniformly flow over the top surface of the circuit board. Hence, hot air is only partially driven out of the case. As a result, the total heat dissipation performance of the blade server is decreased greatly. And in turn, the blade server may operate abnormally or even malfunction. Thus, it is desirable to provide a blade server having improved connection arrangement for allowing cold air current to uniformly flow over the top surface of the circuit board so as to carry out the required heat dissipation of the circuit board and thus the blade server may not operate in an overheat condition.

SUMMARY OF THE INVENTION

After considerable research and experimentation, a connection arrangement of blade server according to the present invention has been devised so as to overcome the above drawback (e.g., overheat) of the prior blade server.

It is an object of the present invention to provide a connection arrangement of a blade server comprising a case having a plurality of holes at a front of the case, a first circuit board and a second circuit board both in the case, and a plurality of walls disposed between the first circuit board and the second circuit board for forming a passage between the first circuit board and the second circuit board. The passage has two ends open to the front and the rear of the case. An electronic device (e.g., hard disk drive) is adapted to electrically connect to the second circuit board by insertion. A channel corresponding to the passage is then formed between the electronic device and the first circuit board. A heat dissipation device is provided on the first circuit board proximate the rear of the case. The activating heat dissipation device is adapted to drive hot air out of the case. At the same time, external cold air is drawn into the case through the holes to form a cold air current. The cold air current can uniformly flow from the passage and the channel over a top surface of the first circuit board. By utilizing this connection arrangement of the blade server, not only heat dissipation performance of the blade server is improved but also the electronic device does not occupy space on the first circuit board. As a result, more space of the first circuit board is saved for mounting other electronic circuits and/or electronic components.

It is another object of the present invention to provide a connection arrangement of a blade server comprising a first circuit board including a heat dissipation device and a panel provided at a front of the circuit board, the panel having a plurality of holes. The heat dissipation device is provided on the first circuit board proximate its rear. A plurality of walls are formed on the first circuit board. The walls are disposed between the first circuit board and a second circuit board. A passage is thus formed between the first circuit board and the second circuit board. The passage has two ends open to the front panel and the rear heat dissipation device. An electronic device (e.g., hard disk drive) is adapted to electrically connect to the second circuit board by insertion. A channel corresponding to the passage is then formed between the elevated electronic device and the first circuit board. The activating heat dissipation device is adapted to drive hot air out of a top surface of the first circuit board and draw external cold air into the blade server through the holes to form a cold air current. The cold air current can uniformly flow from the passage and the channel over a top surface of the first circuit board. Thus, not only heat generated by components of the first circuit board is substantially dissipated, but also the electronic device does not occupy space on the first circuit board. As a result, more space of the first circuit board is saved for mounting other electronic circuits and/or electronic components.

The above and other objects, features and advantages of the present invention will become apparent from the following detailed description taken with the accompanying drawings.

DETAILED DESCRIPTION OF THE PREFERRED EMBODIMENTS

Figure 1:
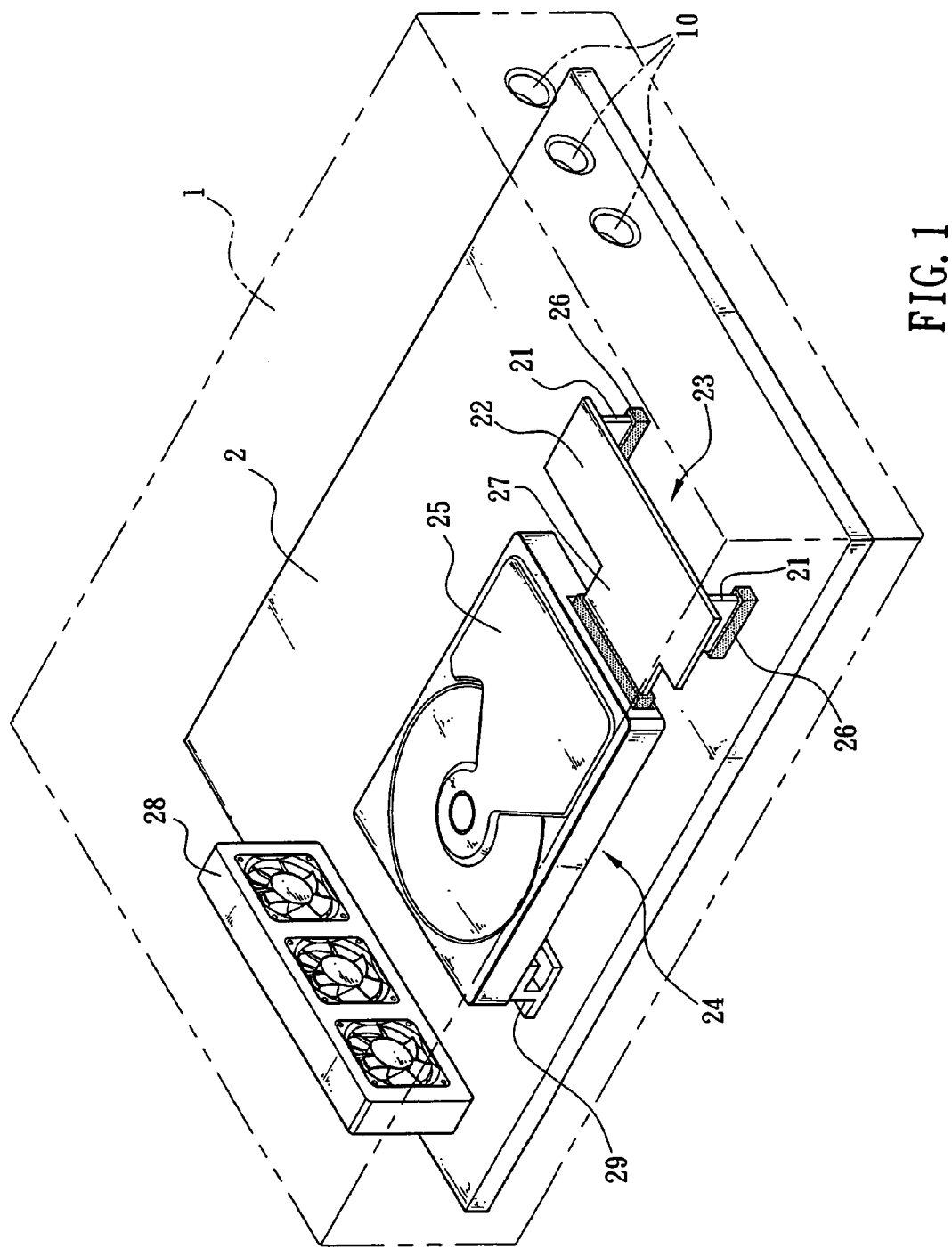
FIG. 1 is a schematic perspective view of a first preferred embodiment of blade server according to the invention.

Referring to FIG. 1, a blade server incorporating a connection arrangement in accordance with a first preferred embodiment of the invention is shown. The blade server comprises a case 1 including a plurality of holes 10 at the front of the case 1, a first circuit board 2 in the case 1 and including a plurality of walls 21, a second circuit board 22, and a heat dissipation device 28. The walls 21 are disposed between the first circuit board 2 and the second circuit board 22 and a passage 23 is thus formed between the first circuit board 2 and the second circuit board 22. The passage 23 has two ends open to the front and the rear of the case 1. An electronic device (e.g., hard disk drive) 25 is adapted to electrically connect to the second circuit board 22 by insertion. A channel 24 corresponding to the passage 23 is then formed between the electronic device 25 and the first circuit board 2. The channel 24 has two ends open to both sides of the case 1. The heat dissipation device 28 is provided on the first circuit board 2 proximate the rear of the case 1. The activating heat dissipation device 28 is adapted to drive hot air out of the case 1. At the same time, external cold air is drawn into the case 1 through the holes 10 to form a cold air current. The cold air current can uniformly flow from the passage 23 and the channel 24 over a top surface of the first circuit board 2. Thus, not only heat dissipation performance of the blade server is improved but also the electronic device 25 does not occupy wiring space on the first circuit board 2. As a result, more space of the first circuit board 2 is saved for mounting other electronic circuits and/or electronic components.

Figure 2:
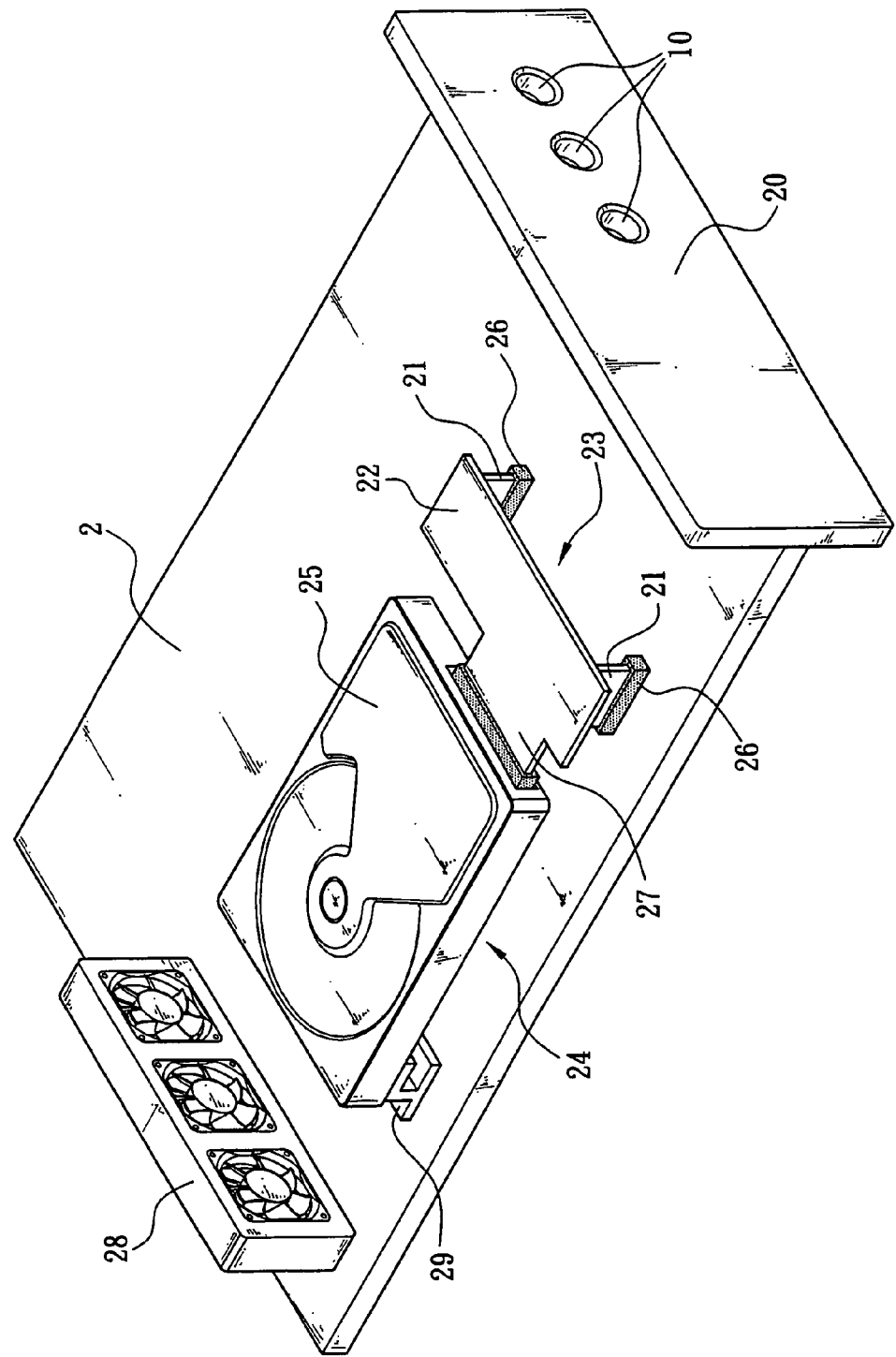
FIG. 2 is a schematic perspective view of a second preferred embodiment of blade server according to the invention with cover removed.

Referring to FIG. 2, a blade server incorporating a connection arrangement in accordance with a second preferred embodiment of the invention is shown. The blade server comprises a first circuit board 2 including a heat dissipation device 28, a panel 20, a plurality of walls 21, and a second circuit board 22. The panel 20 is provided at the front of the first circuit board 2. The panel 20 comprises a plurality of holes 10. The heat dissipation device 28 is provided on the first circuit board 2 proximate its rear. The walls 21 are disposed between the first circuit board 2 and the second circuit board 22 and a passage 23 is thus formed between the first circuit board 2 and the second circuit board 22. The passage 23 has two ends open to the front panel 20 and the rear heat dissipation device 28. An electronic device (e.g., hard disk drive) 25 is adapted to electrically connect to the second circuit board 22 by insertion. A channel 24 corresponding to the passage 23 is formed between the electronic device 25 and the first circuit board 2. The channel 24 has two ends open to both sides of the first circuit board 2. The activating heat dissipation device 28 is adapted to drive hot air out of a top surface of the first circuit board 2. At the same time, external cold air is drawn into the blade server through the holes 10 to form a cold air current. The cold air current can uniformly flow from the passage 23 and the channel 24 over a top surface of the first circuit board 2. Thus, not only heat dissipation performance of the first circuit board 2 is improved but also the electronic device 25 does not occupy space on the first circuit board 2. As a result, more space of the first circuit board 2 is saved for mounting other electronic circuits and/or electronic components.

Referring to FIGS. 1 and 2 again, in each of the above embodiments the wall 21 is implemented as a connector having one end inserted into either slot 26 on the first circuit board 2 and the other end electrically connected to the second circuit board 22. Also, one wall 21 is adapted to communicate signals between the first circuit board 2 and the second circuit board 22 such that the electronic device 25 is adapted to communicate signals with the first circuit board 2 through the second circuit board 2 and one wall 21. Further, the other wall 21 is adapted to transfer electric current between the first circuit board 2 and the second circuit board 22 such that the electronic device 25 connected to the second circuit board 22 is adapted to receive electric current from the first circuit board 2. Furthermore, a connector 27 is projected from a rear end of the second circuit board 22. The connector 27 is adapted to insert into the electronic device 25.

Referring to FIGS. 1 and 2 again, in each of the above embodiments there is further provided at least one support 29 on the first circuit board 2. The support 29 is mounted between the first circuit board 2 and the electronic device 25 in which a bottom of the support 29 is fixedly connected to the first circuit board 2 and a top thereof is adapted to support the electronic device 25. The channel 24 between the electronic device 25 and the first circuit board 2 is thus maintained by the support 29 and the walls 21.

Referring to FIGS. 1 and 2 again, in each of the above embodiments the electronic device 25 is implemented as a hard disk drive (e.g., SATA hard disk drive). The hard disk drive 25 is electrically connected to the connector 27 of the second circuit board 22. Thus, signals and electric current can be communicated and transferred between the hard disk drive 25 and the first circuit board 2 respectively. The heat dissipation device 28 comprises a plurality of fans adapted to drive hot air caused by the operating first circuit board 2 out of the top surface of the first circuit board 2. As a result, surface temperature of the first circuit board 2 is decreased significantly.

While the invention herein disclosed has been described by means of specific embodiments, numerous modifications and variations could be made thereto by those skilled in the art without departing from the scope and spirit of the invention set forth in the claims.

What is claimed is:

1. A connection arrangement of a blade server comprising:
   a case;
   a plurality of holes disposed at a front of the case; and
   a first circuit board disposed in the case, and including a heat dissipation device disposed at a rear of the case and two spaced slots on a top surface of the first circuit board;
   a second circuit board adapted to electrically connect to an electronic device; and
   a plurality of connectors disposed between the first circuit board and the second circuit board for forming a passage between the first circuit board and the second circuit board, wherein the passage has two ends open to the front and the rear of the case, and each of the connectors has one end inserted into either slot of the first circuit board and the other end electrically connected to the second circuit board; and
   at least one support member mounted between the first circuit board and the electronic device, the support member having a bottom fixedly connected to the first circuit board and a top adapted to support the electronic device for forming a channel between the first circuit board and the electronic device, wherein the channel cooperates with the passage to allow a cold air current to uniformly flow over the top surface of the first circuit board in a line between the front and rear of the case.

2. The connection arrangement of claim 1, wherein one of the connectors is adapted to transmit signals between the first circuit board and the second circuit board, and another one of the connectors is adapted to transfer electric current between the first circuit board and the second circuit board.

3. The connection arrangement of claim 1, wherein the second circuit board comprises a connector projected from its rear end, the connector being adapted to insert into the electronic device.

4. A connection arrangement of a blade server comprising:
- a first circuit board, including a heat dissipation device disposed at a rear of the first circuit board and two spaced slots on a top surface thereof;
- a panel disposed at a front of the first circuit board, the panel including a plurality of holes;
- a second circuit board adapted to electrically connect to an electronic device;
- a plurality of connectors disposed between the first circuit board and the second circuit board for forming a passage between the first circuit board and the second circuit board, wherein the passage has two ends open to the front and the rear of the first circuit board, and each of the connectors has one end inserted into either slot of the first circuit board and the other end electrically connected to the second circuit board; and
- at least one support member mounted between the first circuit board and the electronic device, the support member having a bottom fixedly connected to the first circuit board and a top adapted to support the electronic device for forming a channel between the first circuit board and the electronic device, wherein the channel cooperates with the passage to allow a cold air current to uniformly flow over the top surface of the first circuit board in a line between the front and rear of the first circuit board.

5. The connection arrangement of claim 4, wherein one of the connectors is adapted to transmit signals between the first circuit board and the second circuit board and another one of the connectors is adapted to transfer electric current between the first circuit board and the second circuit board.

6. The connection arrangement of claim 4, wherein the second circuit board comprises a connector projected from its rear end, the connector being adapted to insert into the electronic device.

* * * * *